(12) United States Patent
Gatherer et al.

(10) Patent No.: US 6,980,605 B2
(45) Date of Patent: Dec. 27, 2005

(54) MAP DECODING WITH PARALLELIZED SLIDING WINDOW PROCESSING

(76) Inventors: Alan Gatherer, 2105 Bluebonnet Dr., Richardson, TX (US) 75082; Tod D. Wolf, 2107 Oak Brook Dr., Richardson, TX (US) 75081; Armelle Laine, 13 rue Aubernon, 06600 Antibes (FR)

( * ) Notice: Subject to any disclaimer, the term of this patent is extended or adjusted under 35 U.S.C. 154(b) by 694 days.

(21) Appl. No.: 09/772,499

(22) Filed: Jan. 29, 2001

(65) Prior Publication Data

US 2001/0046269 A1    Nov. 29, 2001

Related U.S. Application Data

(60) Provisional application No. 60/179,055, filed on Jan. 31, 2000.

(51) Int. Cl.$^7$ ............... H03D 1/00; H04L 27/06
(52) U.S. Cl. ............. 375/340; 375/316; 375/238; 375/239; 375/242; 375/256; 375/257; 375/286; 375/353
(58) Field of Search ................. 375/340, 242, 375/262, 265, 238, 239, 256, 257, 286, 316, 375/353; 714/796, 794; 178/63, 118; 329/300, 329/304, 311

(56) References Cited

U.S. PATENT DOCUMENTS

| 5,933,462 | A * | 8/1999 | Viterbi et al. ............. 375/341 |
| 6,304,996 | B1 * | 10/2001 | Van Stralen et al. ........ 714/796 |
| 6,563,877 | B1 * | 5/2003 | Abbaszadeh ............... 375/242 |
| 6,754,290 | B1 * | 6/2004 | Halter ....................... 375/340 |

OTHER PUBLICATIONS

"An Intuitive Justification and a Simplified Implementation of the MAP Decoder for Convolutional Codes", Andrew J. Viterbi, IEEE Journal on Selected Areas in Communications, vol. 16, No. 2, Feb. 1998. pp. 260-264.

"Optimal Decoding of Linear Codes for Minimizing Symbol Error Rate", L. R. Bahl et al., IEEE Transactions on Information Theory, Mar. 1974, pp. 284-287.

"Turbo Coding", Chris Heegard, et al., The Kluwer International Series in Engineering and Computer Science, Kluwer Academic Publishers, Copyright 1999.

"Trellis Coding", Christian Schlegel, IEEE Press, Copyright 1997, ISBN 0-7803-1052-7.

"Reconfigurable Signal Processor For Channel Coding and Decoding in Low SNR Wireless Communications", Halter, S., et al. Signal Processing Systems, 1998. SIPS 98. 1998 IEEE Workshop on Cambridge, MA, USA, Oct. 8-10, 1998, New York, NY, pp. 260-274, XP010303741, ISBN: 0-7803-4997-0.

"Soft-Output Decoding Algorithms In Iterative Decoding of Turbo Codes", Benedetto, S., et al., TDA Progress Report, Feb. 1996, pp. 63-87, XP002932926.

"Fixed Point Implementation For Turbo Codes", Tri Ngo, Ingrid Verbauwhede, Article from the Internet, 'Online, 1999, XP002290784, Retrieved from the Internet: URL; www.ucop.edu/research/micro/98_99/98_161.pdf> 'retrieved on Jul. 29, 2004.

"Optimal Decoding of Linear Codes for Minimizing Symbol Error Rate", Bahl, L.R., et al., Mar. 1974, IEEE Transactions on Information theory, IEEE Inc. New York, US, pp. 284-287, XP000760833, ISSN: 0018-9448.

* cited by examiner

*Primary Examiner*—Stephen Chin
*Assistant Examiner*—Erin M. File
(74) *Attorney, Agent, or Firm*—Ronald O. Neerings; Wade James Brady, III; Frederick J. Telecky, Jr.

(57) ABSTRACT

A turbo decoder in which a sliding-block MAP decoder pipelines the forward-propagating and backward-propagating computations.

11 Claims, 5 Drawing Sheets

| CLOCK CYCLE | | | | | TIME → |
|---|---|---|---|---|---|
| 1 | 2 | 3 | 4 | 5 | |
| $\beta_0$,ADD | $\beta_0$,M* | $\beta_0$,N1 | $\beta_0$,N2 | | |
| | $\beta_1$,ADD | $\beta_1$,M* | $\beta_1$,N1 | $\beta_1$,N2 | |
| | | $\beta_2$,ADD | $\beta_2$,MAX* | $\beta_2$,N1 | $\beta_2$,N2 |
| | | | $\beta_3$,ADD | $\beta_3$,MAX* | $\beta_3$,N1 |
| | | | | ⋮ | ⋮ |

|  | Start Prolog | End Prolog | Start Reliability | End Reliability |
|---|---|---|---|---|
| $\beta_0$ | 123 | 100 | 99 | 0 |
| $\beta_1$ | 223 | 200 | 199 | 100 |
| $\beta_2$ | 323 | 300 | 299 | 200 |
| $\beta_3$ | 423 | 400 | 399 | 300 |
| $\alpha_0$ | N/A | N/A | 0 | 99 |
| $\alpha_1$ | 76 | 99 | 100 | 199 |
| $\alpha_2$ | 176 | 199 | 200 | 299 |
| $\alpha_3$ | 276 | 299 | 300 | 399 | ns
MAP DECODING WITH PARALLELIZED SLIDING WINDOW PROCESSING

This application claims priority under 35 U.S.C. §119(e)(1) of provisional application Ser. No. 60/179,055, filed on Jan. 31, 2000, the entirety of which is incorporated herein by reference.

BACKGROUND AND SUMMARY OF THE INVENTION

The present application relates to wireless communication, and more particularly to turbo decoding and the like.

Background: Error Correction

Coded digital communication systems use error control codes to improve data reliability at a given signal-to-noise ratio (SNR). For example, an extremely simple form (used in data storage applications) is to generate and transmit a parity bit with every eight bits of data; by checking parity on each block of nine bits, single-bit errors can be detected. (By adding three error-correction bits to each block, single-bit errors can be detected and corrected.) In general, error control coding includes a large variety of techniques for generating extra bits to accompany a data stream, allowing errors in the data stream to be detected and possibly corrected.

Background: Trellis Coding

One of the important techniques for error control is trellis coding. In this class of techniques some constraints are imposed on the sequence of symbols, so that certain symbols cannot be directly followed by others. The constraints are often defined by a geometrical pattern (or "trellis") of allowed and disallowed transitions. The existence of constraints on the sequence of symbols provides some structure to the data sequence: by analyzing whether the constraints have been violated, multiple errors can be corrected. This is a very powerful class of coding techniques; the constraint geometry can be higher dimensional, or algebraic formulations can be used to express the constraints, and many variations can be used.

Background: Turbo Coding

The encoder side of a turbo coding architecture typically uses two encoders, one operating on the raw data stream and one on a shuffled copy of the base data stream, to generate two parity bits for each bit of the raw data stream. The encoder output thus contains three times as many bits as the incoming data stream. This "parallel concatenated encoder" (or "PCE") configuration is described in detail below.

The most surprising part of turbo coding was its decoding architecture. The decoder side invokes a process which (if the channel were noiseless) would merely reverse the transformation performed on the encoder side, to reproduce the original data. However, the decoder side is configured to operate on soft estimates of the information bits and refines the estimates through an iterative reestimation process. The decoder does not have to reach a decision on its first pass, but is generally allowed to iteratively improve the estimates of the information bits until convergence is achieved.

Background: MAP Decoders

MAP decoding is a computationally intensive technique, which has turned out to be very important for turbo decoding and for trellis-coded modulation. "MAP" stands for "maximum a posteriori": a MAP decoder outputs the most likely estimate for each symbol in view of earlier AND LATER received symbols. This is particularly important where trellis coding is used, since the estimate for each symbol is related to the estimates for following symbols.

By contrast, a maximum-likelihood ("ML") decoder tries to compute the transmitted sequence for which the actually received sequence was most likely. These verbal statements may sound similar, but the difference between MAP and ML decoding is very significant. ML decoding is computationally simpler, but in many applications MAP decoding is required.

MAP decoding normally combines forward- and back-propagated estimates: a sequence of received symbols is stored, and then processed in one direction (e.g. forward in time) to produce a sequence of forward transition probabilities, and then processed in the opposite direction (backward in time) to produce a sequence of backward transition probabilities. The net estimate for each symbol is generated by combining the forward and backward transition probabilities with the data for the signal actually received. (Further details of this procedure can be found in OPTIMAL DECODING OF LINEAR CODES FOR MINIMIZING SYMBOL ERROR RATE, Bahl, Cocke, Jelinek, and Raviv, *IEEE Transactions on Information Theory*, 1974, which is hereby incorporated by reference.)

The combination of forward and backward computation requires a substantial amount of memory. Since the blocks in advanced cellular communications can be large (e.g. 5120 symbols), the memory required to store a value for each possible transition for each symbol in a block is large. To reduce the memory requirements during decoding, each block of data may be divided into many smaller blocks (e.g. 40 blocks of 128 symbols) for MAP decoding.

The trellis encoding is done on a complete block of data, so that starting and ending states are known for the complete block. However, the starting and ending states are not know for the intermediate blocks. This presents a problem for accurate process of these smaller blocks, but it has been found that simply iterating the forward estimation process for a few symbols before the start of each block will ensure that processing of the first symbol in the block starts from a good set of initial values.

MAP Decoding with Pipelined Windowed Processing

The present application discloses a technique for sub-block processing, in a MAP decoding, which uses pipelining. Processing of alphas is begun, in parallel with processing of betas. Preferably each stage of processing is further internally parallelized; but the pipelining of forward-propagated processing with back-propagated processing provides an additional degree of net improvement in throughput.

Advantages of the disclosed methods and structures, in various embodiments, can include one or more of the following:
Faster processing;
less memory;
more iterations possible in a turbo decoder.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Concurrent operation of system hardware allows simultaneous processing of more than one basic operation. Concurrent processing is often implemented with two well known techniques: parallelism and pipelining.

Parallelism includes replicating a hardware structure in a system. Performance is improved by having multiple structures execute simultaneously on different parts of a problem to be solved.

Pipelining splits the function to be performed into smaller pieces and allocates separate hardware to each piece. More information on parallelism and pipelining can be found in the "The Architecture of Pipelined Computers," by Kogge, which is hereby incorporated by reference.

Figure 1:
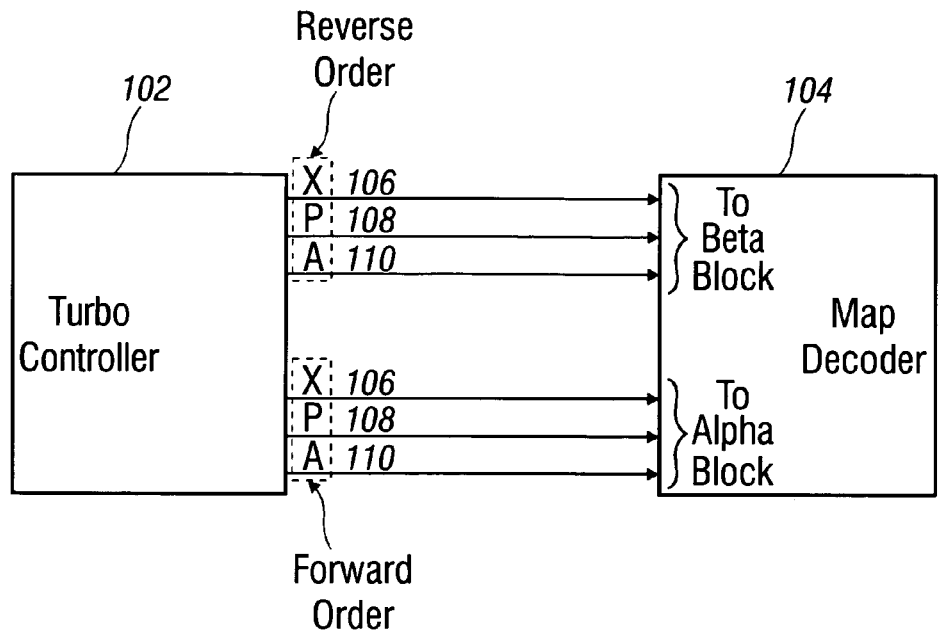
FIG. 1 shows a block diagram of a turbo decoder.

FIG. 1 shows a block diagram of a turbo decoder. Two main blocks, the turbo controller 102 and the MAP decoder 104, are shown. The turbo controller 102 stores the data streams (X, the systematic data 106; P, the parity data 108; and A, the A PRIORI data 110) that serve as input for the MAP decoder 104 and controls the order in which the data is input in the MAP decoder 104. The diagram shows the three data streams being input twice each in the MAP decoder 104. Two separate sets of input data are required because the alpha and beta generation blocks require the data inputs in reverse order. The extrinsic output of the MAP decoder 104 is returned to the controller 102 for another decoding iteration.

Figure 2:
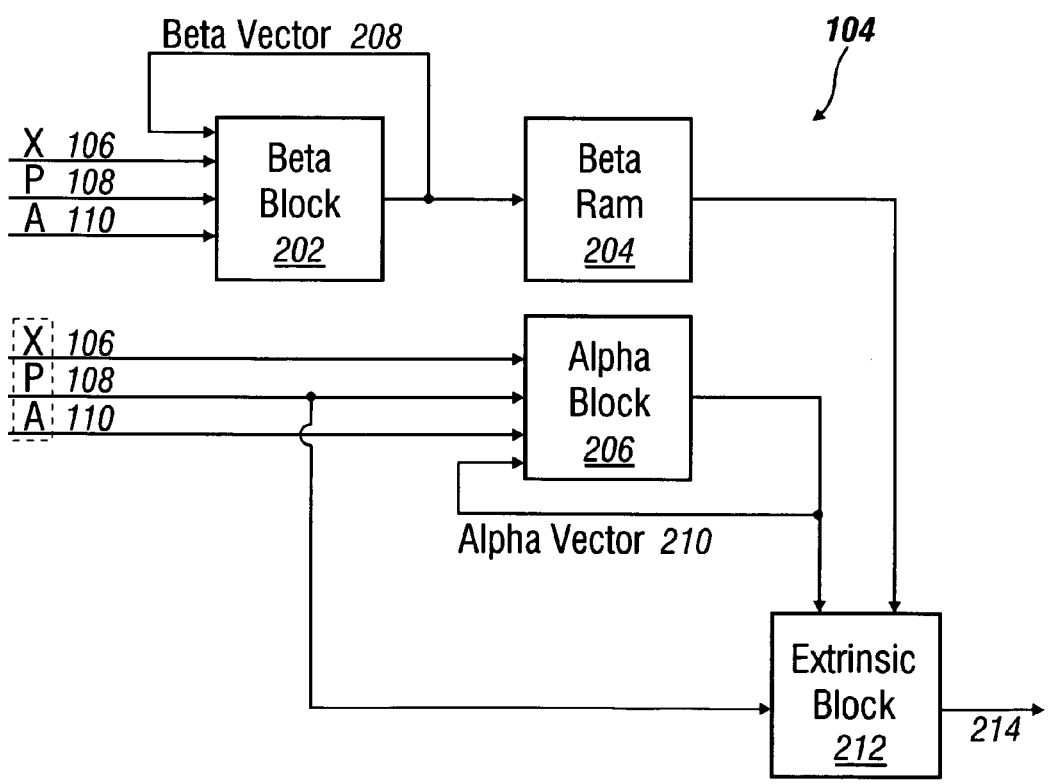
FIG. 2 shows a block diagram of a MAP decoder that uses parallel sliding window processing.

FIG. 2 shows a block diagram of a MAP decoder 104 that uses parallel sliding window processing. A MAP decoder 104 receives the scaled systematic data signal 106, the scaled parity data signal 108, and the A PRIORI signal 110 as its input. There are N number of X signals 106, where N is the size of the interleaver. N X signals 106 are applied for each beta 208 and alpha 210 state vector, which are the respective outputs of the beta 202 and alpha 206 blocks. During beta generation, X 106 is applied in reverse order, and during alpha generation, X 106 is applied in forward order. There are also N number of P signals 108. N P signals 108 are applied for each alpha 210 and beta 208 vector. During beta generation, P 108 is applied in reverse order, and during alpha generation it is applied in forward order. The A PRIORI 110 is either the interleaved or deinterleaved extrinsic data from the previous MAP decoder operation.

There are N A PRIORI signals 110, and one A PRIORI 110 is applied for each beta 208 and alpha 210 vector. A PRIORI 110 is applied the same directions as X 106 and P 108 for beta and alpha generation.

Figure 3:
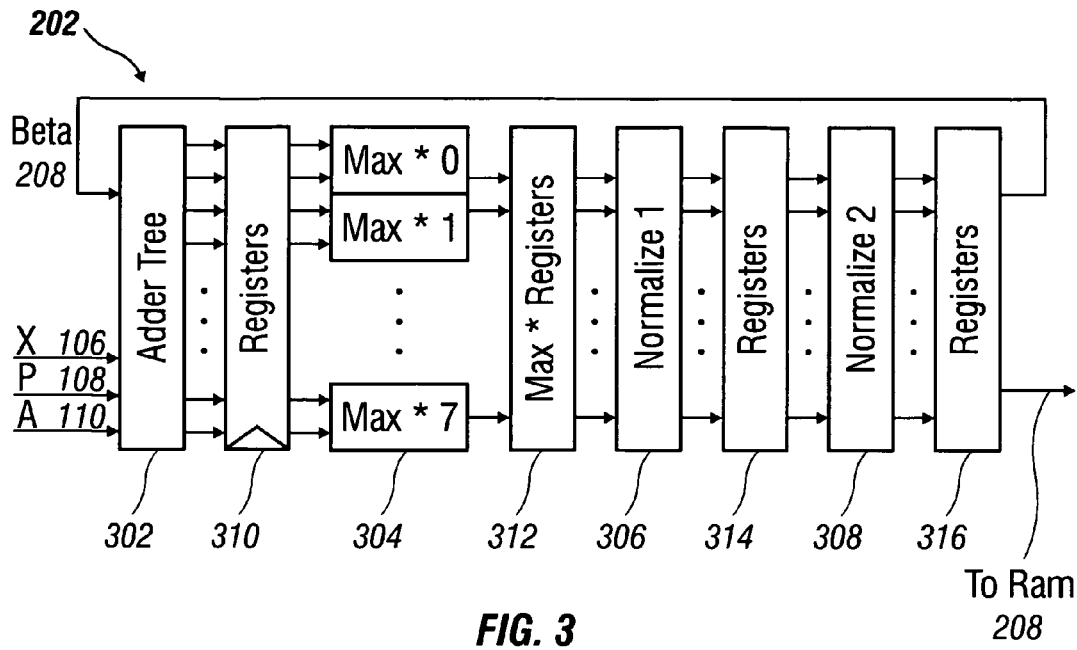
FIG. 3 shows a block diagram of the beta generation block within the MAP decoder.

The beta generation section 202, shown in more detail in FIG. 3, receives inputs X 106, P 108, and A 110. It generates the beta state vector 208, which is stored in beta RAM 204. The alpha generation section 206 receives inputs X 106, P 108, and A 110 (but in reverse order relative to the beta input). The alpha generation block 206, shown in greater detail in FIG. 4, generates the alpha state vector 210. The outputs 208, 210 of the alpha and beta generation sections serve as inputs for the extrinsic generation section 212, shown in FIG. 5. These data streams must be properly sequenced with the parity stream P 108 before being input to the extrinsic section 212.

FIG. 3 shows the beta generation stages. First, during the MAP reset state, the registers are set to their initial conditions for the beta state vector 208. The beta signal 208, X 106, P 108, and A 110 are summed together by the adder tree 302 according to the trellis used to encode the data. (In the preferred embodiment, an 8 state trellis is used). The results are stored in registers 310. In the second stage, the results of the adder 302 are applied to the 8 MAX* blocks 304, and are then stored in the MAX* registers 312. Next, the unnormalized outputs advance to two separate normalization stages 306, 308, each of which has a register 314, 316 to store its results. Thus the total process has 4 stages within the feedback loop of the beta generation block 202, which require 4 clock cycles to complete. This latency (the 4 clock cycles) determines the level of pipelining available.

Figure 4:
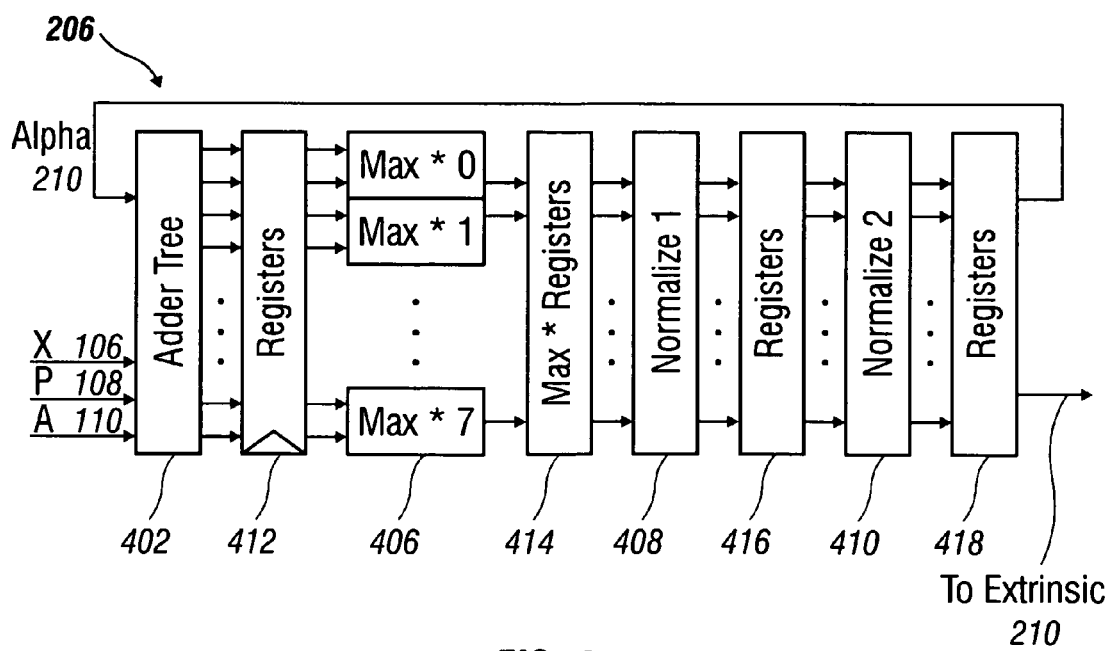
FIG. 4 shows a block diagram of the alpha generation block within the MAP decoder.

The alpha generation section 206 is shown in FIG. 4. First, the registers are set to their initial conditions. Then the data inputs are summed together by the adder 402, and the results are stored in registers 412. These are then input to the MAX* blocks 406 and stored in MAX* registers 414. The alpha generation section 206 also has two normalization stages 408, 410, each with their own registers 416, 418. The latency of the alpha generation stage 206 is thus 4, allowing 4 levels of pipelining to be implemented.

Figure 5:
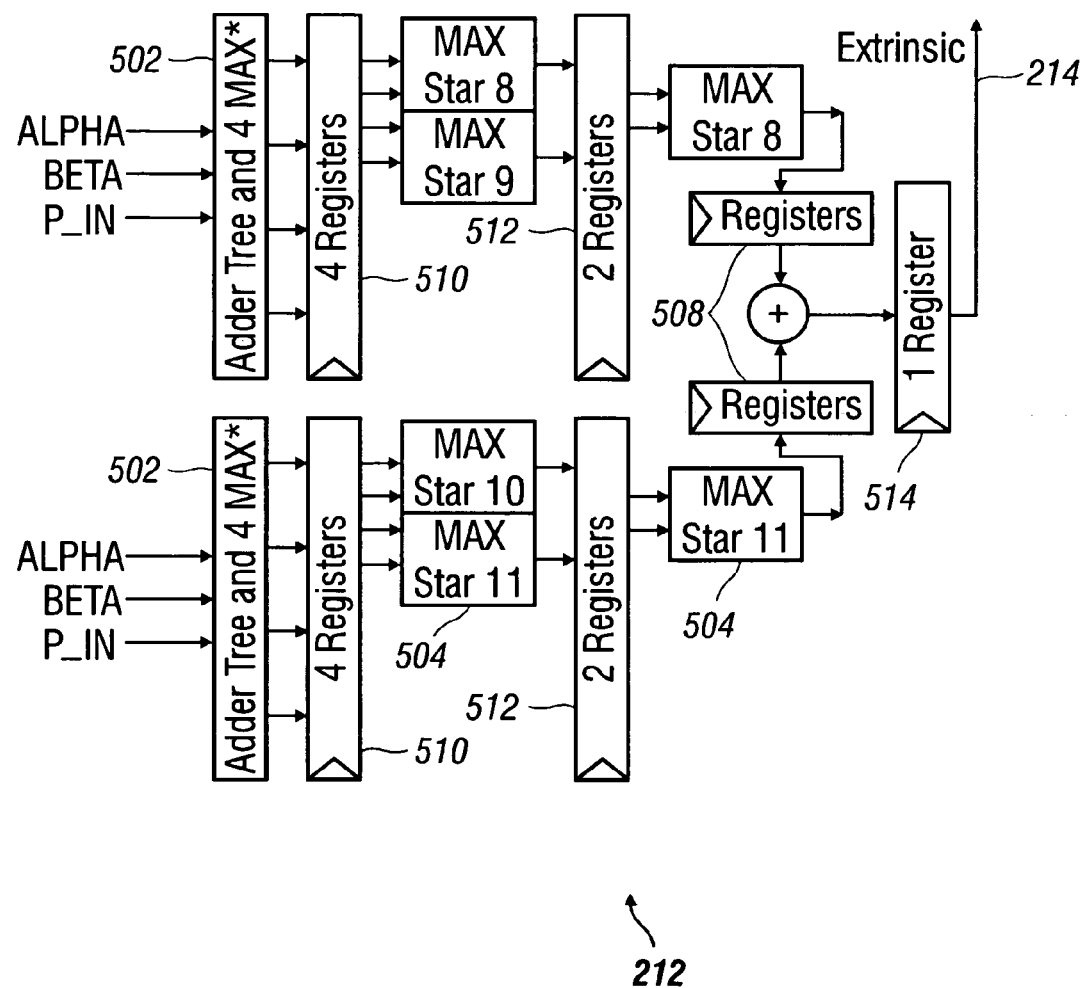
FIG. 5 shows a block diagram of the extrinsic generation block within the MAP decoder.

Operating in parallel with the alpha generation section is the extrinsic generation section 212, shown in FIG. 5. Alpha 210, beta 208, and P 108 are summed together by the adders 502 according to the trellis used, and the results are stored in registers 510. In the second stage, these results are applied to the MAX* blocks 504, and then stored in the MAX* registers 512. These results are again applied to MAX* blocks 504 and then stored in registers 508. The result is summed and stored in another register 514, and the output is the extrinsic signal 214.

Parallelism with Sliding Windows

A sliding window approach basically consists of dividing the N sized block of incoming data into several smaller blocks. Each of these smaller blocks is called a sliding window block. These sliding window blocks are MAP decoded each independently, with a prolog for both the alpha and beta vectors. The decoding for the individual alpha and beta sliding window blocks is done in parallel. Since the initial conditions are not known for the individual sliding window blocks, the prologs are used to reach a good set of initial values.

By starting the update of the alpha at a point sufficiently inside the previous block and starting the update of the beta at a point sufficiently inside the next block, the decoder can "forget" the initial conditions and converge before it begins operating on the actual data. the prolog section size used is generally 3 or 4 times the number of states in the trellis. The first alpha and last beta sliding block will originate from a known state, and the size of their respective prolog sections will be 3 for an 8 state trellis (for example).

The innovative alpha prolog allows parallel processing of both the alpha and beta sliding window blocks of data. Depending on the specific implementation used, each update of alpha or beta takes a few clock cycles to run (4 clock cycles in the above embodiment). This latency determines the degree of pipelining possible in the system. In the preferred embodiment, there are four levels of pipelining within each alpha and beta block (meaning the data within each of the alpha and beta generation stages is pipelined, or broken into separate sets of data and independently operated on by successive stages within the beta generation section). There is also a degree of parallelism between the alpha and beta blocks themselves, meaning these two sections operate simultaneously to produce extrinsic input.

The alpha and beta vector generation processes are divided into multiple stages, as shown above. These stages are within the iteration loops of the alpha and beta vector generation, shown in FIGS. 3 and 4. The number of stages would be equal to the latency for a particular architecture. In the preferred embodiment, these stages are the Adder, the MAX*, and two Normalization stages. The latency of these stages dictates the degree of parallel processing possible. For example, in the preferred embodiment this latency is 4, meaning 4 sliding-window blocks can be processed in parallel. Thus, 4 sliding-window blocks make up one sub-block.

Figures 6, 7:
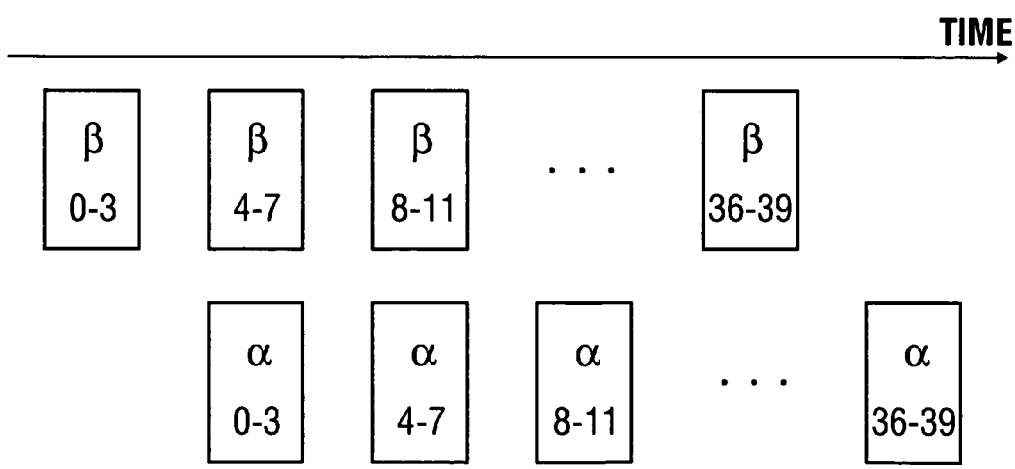
FIG. 6 is a timing chart of the pipelining within the beta block.
FIG. 7 shows the timing offset between generation of alpha and beta sliding window blocks.

The pipelining of the sliding blocks is shown in FIG. 6. During the first clock cycle, beta0 (the first sliding block) enters the adder stage. In the second clock cycle, beta0 enters the MAX* stage, and beta1 enters the adder stage. In the third clock cycle, beta0 enters the first normalization stage (the third stage of beta generation), beta1 enters the MAX* stage, and beta2 enters the adder stage. Next, beta0 enters the second normalization stage, beta1 enters the first normalization stage, beta2 enters the MAX* stage, and beta3 enters the adder stage. The intermediate values for each stage are stored in registers, as shown above.

Either the beta or alpha stages are stored in memory so that the data input to the extrinsic section can be synchronized. In the preferred embodiment, beta processing begins one sub-block before alpha processing (Note that this staggering could be eliminated by adding another RAM block to store the alpha outputs.) This staggering is shown in FIG. 7. The first sub-block (which is a number of sliding blocks equal to the latency of the architecture—4 in the preferred embodiment) of the beta section can be processed while the alpha section is idle. Next, the second set of sliding blocks of the beta section (i.e., the second sub-block) is processed while the first set of sliding blocks of the alpha section are processed. The extrinsic sections are processed in parallel with the alpha section. This reduces the memory requirement for storing both the alpha and beta state vectors because the alpha outputs can be directly applied to the extrinsic as they are generated. Since the extrinsic generates output (and requires input) one sub-block at a time, the beta RAM only needs to store one sub-block of data at a time. (Note that the alpha and beta processing could be reversed. This would require the alpha outputs to be stored in memory, and beta and the extrinsic blocks would run in parallel.)

Figures 8, 9:
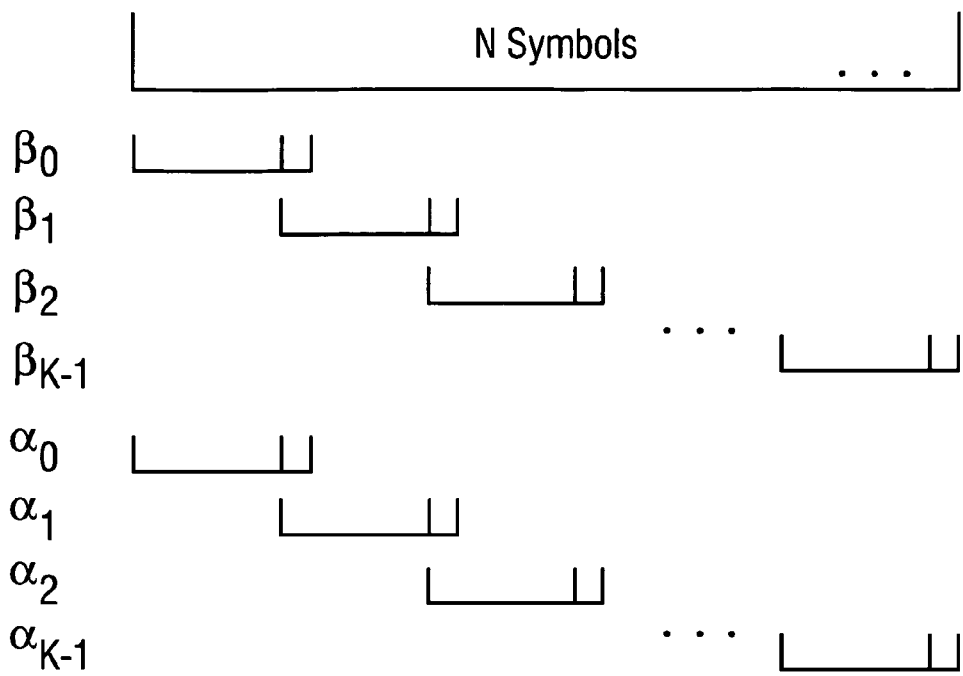
FIG. 8 shows the correspondence between the alpha and beta sliding window blocks, with prologs.
FIG. 9 shows an example of the order in which beta and alpha bits are processed.

FIG. 8 shows the correspondence between alpha and beta sliding-window blocks. The entire data block consists of N symbols plus a number of tail bits. This block is broken into sub-blocks, which are further divided into sliding-window blocks. One sliding-window block is processed per clock cycle. Each sliding-window block includes a prolog. The beta prologs consist of several symbols to the right of the sliding window. The alpha prolog consists of the several bits to the left of the sliding window. This is shown by the overlap between successive sliding blocks in the figure. Each beta sliding window is processed in reverse relative to the alpha sliding blocks.

FIG. 9 shows an example of the order in which beta and alpha bits are processed. This example assumes a sliding window size of 100, a prolog length of 24, and 4 sliding windows per sub-block. The sliding block beta0 begins at the start of the prolog at bit 123. Next, the prolog ends at bit 100. The reliability data begins at bit 99, and ends at bit zero. The alpha sliding blocks are similarly divided. (Note the first two entries for alpha do not exist, because there is no prolog for the beginning of the block since the start and end points are known.)

The extrinsic cannot be processed in parallel with both the alpha and beta generation processes, because the extrinsic input data, which requires data from alpha, beta, and the parity data, must be input in a certain order. The following shows the indexing of the extrinsic input. E0 (corresponding to alpha0 and beta0) goes from bit 0 to 99. E1 goes from 100 to 199, and so on, given a sliding window size of 100. The input required by this example would be as follows. In the first clock cycle, the soft estimate data relating to bit 0 from alpha, beta, and P are input to the extrinsic. In the second clock cycle, data associated with bit 100 from the three inputs is required. In the third clock cycle, the data associated with bit 200 is required. In the fourth clock cycle, the data associated with bit 300 is required. In the fifth clock cycle, the input reverts back to the data associated with bit 1 (the first clock cycle input shifted one bit). In the next cycle, the bit 101 data, and so on. Thus the betas must be stored in RAM after they are generated, because they are generated in a different order than the alpha bits and parity bits, and are not required at generation as are the alpha bits and parity bits. When the corresponding alphas and betas have been generated, the extrinsic may be calculated.

Definitions:

Following are short definitions of the usual meanings of some of the technical terms which are used in the present application. (However, those of ordinary skill will recognize whether the context requires a different meaning.) Additional definitions can be found in the standard technical dictionaries and journals.

MAX*: MAX* is a maximum finding approximation for the natural log function, given by the following equation:

$$\ln[e^A + e^B] \approx MAX^* = MAX(A+B) + f(|A-B|)$$

where f(A−B) is a correction term. A lookup table is usually used for this value, which makes the above expression an approximation. If the expression $$\ln[1 + e^{-|A-B|}]$$

is used instead of a lookup table, then the MAX* definition becomes an exact equality, not an approximation.

MAP decoder: Maximum A-Posteriori. MAP decoders use a detection criterion that leads to the selection of x that maximizes the probability p(x/r) of a symbol x given the received information r.

Extrinsic: Outputs of decoders that estimate the value of a decoded bit. Extrinsics are usually soft estimates.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

Though the preferred embodiment is given in specific detail, many alterations can be made in its implementation without escaping the scope of the inventive concepts herein disclosed. For instance, the latency of each state vector generation stage can be varied (by adding registers, or other means), and thus the degree of possible pipelining will vary. The size of the trellis can also be changed without altering the inventive concepts applied in the embodiment. The betas, alphas, and extrinsics may be generated in various parallel combinations, with only minor changes in RAM storage required.

Those of skill in the art will know that the definitions of inputs used in the present application (the systematic data X, and the parity data P) may be generalized to cover a broader range of applications. For instance, these inputs may differ in such applications as MAP equalization or turbo trellis decoding. In some applications, the inputs may not be soft estimates of bits, but rather they may be soft estimates of other variables. The disclosed innovations are intended to cover all such variations in implementation.

The disclosed innovations of the present application are applicable to any MAP architecture. For instance, any implementation of the disclosed inventive concepts in turbo decoders which use MAP decoders is within the contemplation of the invention. Any MAP operations, e.g., MAP equalization, are within the contemplation of the present application. MAP equalization is the process of describing the channel function as the data input to the channel constrained on a trellis to produce the observed output. The input to the channel can then be estimated in a maximum a priori sense by applying a MAP decode to the trellis diagram and the observed channel output. This is useful if (a) soft output is required from the equalizer, (b) a more accurate estimate of the input to the channel is required than can be got using a linear filter or equalizer, or (c) an iterative joint decode of the channel and the applied FEC is required. In general, MAP finds use in any situation where the data observed is known to have been generated by input to a linear trellis.

Likewise, MAP architectures with software, as well as hardware, implementations is within the contemplation of the invention. In today's DSPs very high processing rates are achieved by using deep pipelining of the data path. This means the DSP cannot be efficiently used in a feedback process such as beta and alpha updates. Using the present invention allows several blocks to be simultaneously processed by the DSP in a pipelined fashion, which considerably speeds up the operation in a deeply pipelined DSP architecture.

Further background material on the state of the art in MAP decoders and coding can be found in TURBO CODING, by Heegard and Wicker; TRELLIS CODING, by Schlegel; ERROR CONTROL SYSTEMS, by Wicker, and AN INTUITIVE JUSTIFICATION AND A SIMPLIFIED IMPLEMENTATION OF THE MAP DECODER FOR CONVOLUTIONAL CODES, Andrew Viterbi, IEEE Journal on Selected Areas of Communications, Vol. 16, No. 2, February 1998, all of which are hereby incorporated by reference.

What is claimed is:

1. A Maximum a Posteriori (MAP) decoding method for processing a block of data in a sequence of blocks of data, according to at least one sequencing constraint, the block of data comprising contiguous partial blocks of data, the method comprising the steps of, for each of plurality of partial blocks of data:

sequentially processing data elements of the partial block in a first direction, after first processing, in said first direction, prolog elements from an adjacent partial block in accordance with said sequencing constraint; and sequentially processing said data elements of the partial block in a second direction, after first processing, in said second direction, prolog elements from an adjacent partial block in accordance with said sequencing constraint.

2. The method of claim 1, wherein the processing of data elements in the first direction, and the processing of data elements in the second direction are done in parallel.

3. The method of claim 1, wherein each of step of processing data elements is pipelined so that a plurality of the operations in the sequence operate in parallel on different blocks.

4. A method for parallel Maximum a Posteriori (MAP) processing of a lattice-coded block of data, comprising the steps of:

dividing the data into contiguous sliding window blocks, and, for each of multiple ones of said sliding window blocks, a) sequentially processing the elements of the respective sliding window block in a first direction, after first processing, in said first direction, prolog elements from an adjacent sliding window block in accordance with a sequencing constraint; and b) sequentially processing the elements of the respective sliding window block in a second direction, after first processing, in said second direction, prolog elements from an adjacent sliding window block in accordance with said sequencing constraint;

wherein said steps a) and b) are performed at least partly in parallel with each other.

5. The method of claim 4, wherein at least one of steps a) and b) comprises a sequence of operations to be performed on each sliding window block;

and wherein the at least one of steps a) and b) is pipelined so that a plurality of the operations in the sequence operate in parallel on different sliding window blocks.

6. The method of claim 4, wherein the step of sequentially processing the elements of the respective sliding window block in the first direction comprises:

combining probability metrics on a first sliding window block of data in at least one adder tree; and performing a maximum-finding operation on a first previous sliding window block of data to combine ones of said metrics that correspond to alternative possibilities;

wherein the combining step and the step of performing a maximum-finding operation are at least partly performed in a parallelized pipeline relationship with each other.

7. The method of claim 6, wherein the maximum-finding operation is an exponent-logarithm equation.

8. The method of claim 6, wherein the maximum-finding operation is an estimation of an exponent-logarithm function.

9. The method of claim 6, wherein the step of sequentially processing the elements of the respective sliding window block in the first direction further comprises:
   performing a normalization operation on the results of said maximum-finding operation on a second previous sliding window block of data;
   wherein the combining step, the step of performing a maximum-finding operation, and the step of performing a normalization operation are at least partly performed in a parallelized pipeline relationship with each other.

10. The method of claim 9, wherein the maximum-finding operation is an exponent-logarithm equation.

11. The method of claim 9, wherein the maximum-finding operation is an estimation of an exponent-logarithm equation.

* * * * *